(12) United States Patent
Lee et al.

(10) Patent No.: US 10,747,047 B2
(45) Date of Patent: Aug. 18, 2020

(54) DISPLAY DEVICE

(71) Applicant: SAMSUNG DISPLAY CO., LTD., Yongin-si, Gyeonggi-do (KR)

(72) Inventors: Hee Keun Lee, Suwon-si (KR); Won Tae Kim, Suwon-si (KR); Yeo Geon Yoon, Suwon-si (KR); Seung Jin Chu, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/247,379

(22) Filed: Jan. 14, 2019

(65) Prior Publication Data

US 2019/0377223 A1 Dec. 12, 2019

(30) Foreign Application Priority Data

Jun. 8, 2018 (KR) .................. 10-2018-0066112

(51) Int. Cl.
*G02F 1/1335* (2006.01)
*H01L 27/32* (2006.01)

(52) U.S. Cl.
CPC .. *G02F 1/133514* (2013.01); *G02F 1/133516* (2013.01); *H01L 27/322* (2013.01); *G02F 1/133512* (2013.01); *G02F 2001/133519* (2013.01)

(58) Field of Classification Search
CPC ......... G02F 1/133514; G02F 1/133512; H01L 27/322; H01L 2933/0041; H01L 31/055; H01L 33/508; H01L 33/504; H01L 33/502; H01L 33/50
See application file for complete search history.

(56) References Cited

U.S. PATENT DOCUMENTS

2015/0255505 A1\* 9/2015 Jeoung .................. G06F 1/1652
257/89

FOREIGN PATENT DOCUMENTS

| KR | 10-2015-0037858 A | 4/2015 |
| KR | 10-2015-0084578 A | 7/2015 |
| KR | 10-2016-0124977 A | 10/2016 |

\* cited by examiner

*Primary Examiner* — Julia Slutsker
(74) *Attorney, Agent, or Firm* — Lewis Roca Rothgerber Christie LLP

(57) ABSTRACT

A display device includes: a light provider; a wavelength conversion layer above the light provider and including a first surface and sides; and a capping layer on the wavelength conversion layer and including a first area provided on the sides of the wavelength conversion layer and a second area provided on the first surface of the wavelength conversion layer, and the first area of the capping layer includes cracks.

20 Claims, 14 Drawing Sheets

DISPLAY DEVICE

CROSS-REFERENCE TO RELATED APPLICATION

This application claims priority to and the benefit of Korean Patent Application No. 10-2018-0066112, filed on Jun. 8, 2018 in the Korean Intellectual Property Office, the entire disclosure of which is incorporated herein by reference.

BACKGROUND

1. Field

Aspects of embodiments of the present disclosure relate to a display device.

2. Description of the Related Art

Display devices have increasingly become important in accordance with developments in multimedia technology. Accordingly, various types of display devices, such as a liquid crystal display (LCD) device, an organic light-emitting diode (OLED) display device, etc., have been developed.

The OLED display device, which uses OLEDs, can emit light and can offer numerous advantages, such as fast response speed, wide viewing angles, and excellent brightness. The OLED display device may realize red-green-blue (RGB) data using OLEDs emitting light of different colors and may realize RGB data using a light converter and OLEDs emitting blue light or white light.

SUMMARY

According to an aspect of embodiments of the present disclosure, a display device is capable of preventing or substantially preventing an active unfilled area (AUA) phenomenon in a display panel by effectively releasing the gases remaining in a light converter.

However, aspects of embodiments of the present disclosure are not restricted to those set forth herein. The above and other aspects of embodiments of the present disclosure will become more apparent to one of ordinary skill in the art to which the present disclosure pertains by referencing the detailed description of some exemplary embodiments of the present disclosure given below.

According to one or more exemplary embodiments of the present disclosure, a display device comprises: a light provider; a wavelength conversion layer above the light provider and including a first surface and sides; and a capping layer on the wavelength conversion layer and including a first area provided on the sides of the wavelength conversion layer and a second area provided on the first surface of the wavelength conversion layer, wherein the first area of the capping layer includes cracks.

According to one or more exemplary embodiments of the present disclosure, a display device comprises: a light provider including a first pixel electrode unit and a second pixel electrode unit adjacent to the first pixel electrode unit in a first direction; and a light converter above the light provider, the light converter including a first wavelength conversion layer above the first pixel electrode unit, a second wavelength conversion layer above the second pixel electrode unit, and a capping layer between the first and second wavelength conversion layers, wherein in a plan view, the first wavelength conversion layer includes first and second sides extending in a second direction, which is perpendicular to the first direction, in a plan view, the second wavelength conversion layer includes third and fourth sides extending in the second direction, the second and third sides are adjacent to each other, and, in a plan view, each of the first, second, third, and fourth sides includes a reference line and a plurality of uneven patterns that are outwardly projected or recessed from the reference line.

According to an aspect of embodiments of the present disclosure, an AUA phenomenon in a display panel can be prevented or substantially prevented by effectively releasing the gases remaining in a light converter.

Other features and aspects of embodiments of the present disclosure may be apparent from the following detailed description, the drawings, and the claims.

BRIEF DESCRIPTION OF THE DRAWINGS

The above and other exemplary embodiments and features of the present disclosure will become more apparent by describing in further detail some exemplary embodiments thereof with reference to the attached drawings, in which.

DETAILED DESCRIPTION

Figure 1:
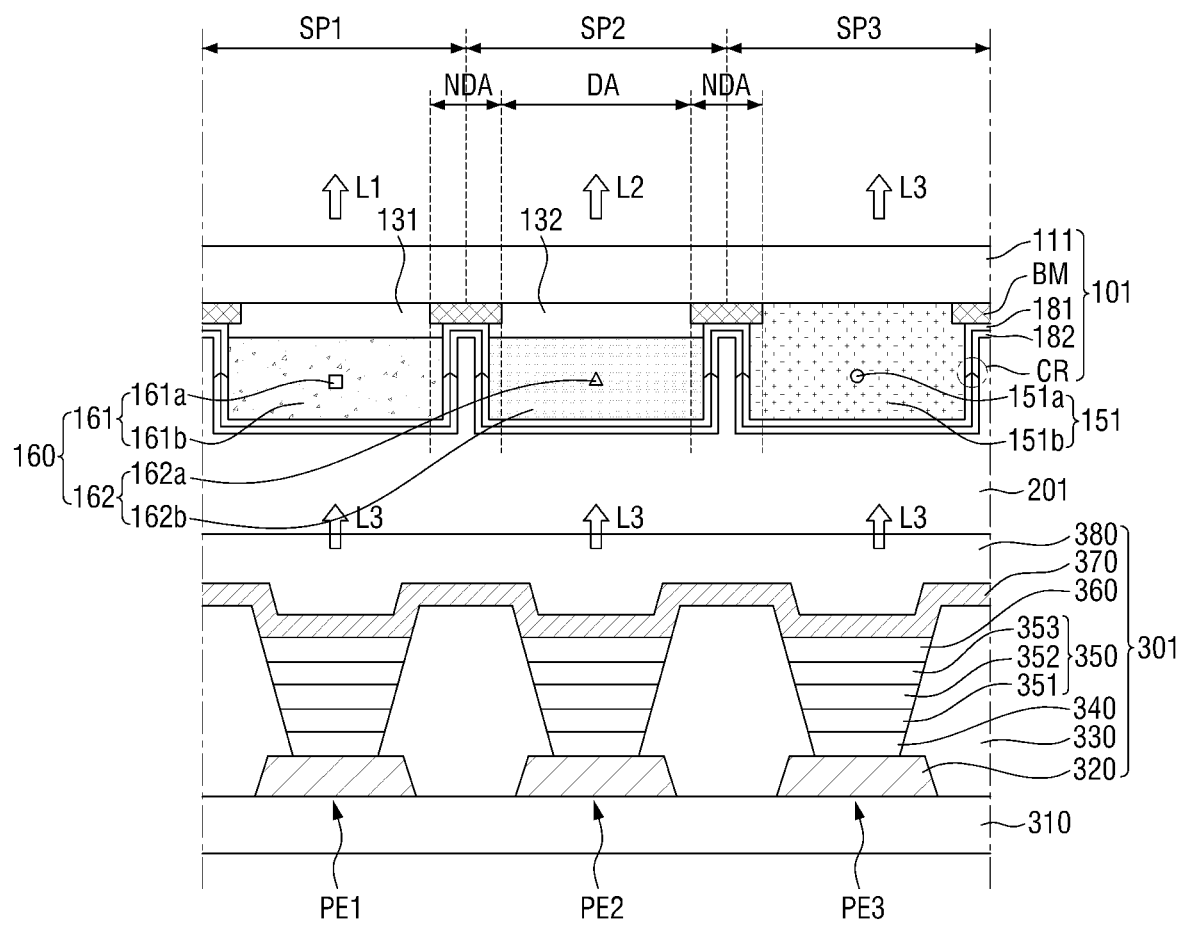
FIG. 1 is a cross-sectional view of a display device according to an exemplary embodiment of the present disclosure.

Features of the inventive concept and methods of accomplishing the same may be understood more readily by reference to the following detailed description of some embodiments and the accompanying drawings. The inventive concept may, however, be embodied in many different forms and should not be construed as being limited to the embodiments set forth herein. Rather, these embodiments are provided so that this disclosure will be thorough and will fully convey the concept of the inventive concept to those skilled in the art, and the inventive concept is to be defined by the appended claims.

The terminology used herein is for the purpose of describing particular embodiments and is not intended to be limiting of the inventive concept. As used herein, the singular forms "a," "an," and "the" are intended to include the plural forms as well, unless the context clearly indicates otherwise. It is to be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is to be understood that when an element or layer is referred to as being "on," "connected to," or "coupled to" another element or layer, it may be directly on, connected, or coupled to the other element or layer or one or more intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

It is to be understood that, although the terms "first," "second," etc. may be used herein to describe various elements, components, regions, layers, and/or sections, these elements, components, regions, layers, and/or sections are not to be limited by these terms. These terms are used to distinguish one element, component, region, layer, or section from another element, component, region, layer, or section. Thus, a "first" element, component, region, layer, or section discussed below could be termed a "second" element, component, region, layer, or section without departing from the teachings of the inventive concept.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which the present application belongs. It is to be further understood that terms, such as those defined in commonly used dictionaries, should be interpreted as having a meaning that is consistent with their meaning in the context of the relevant art and this specification and are not to be interpreted in an idealized or overly formal sense unless expressly so defined herein.

In the drawings, components may be exaggerated or reduced in size for convenience of explanation.

Throughout the specification, like reference numerals refer to like elements.

Some exemplary embodiments of the present disclosure will herein be described with reference to the accompanying drawings.

Figure 2:
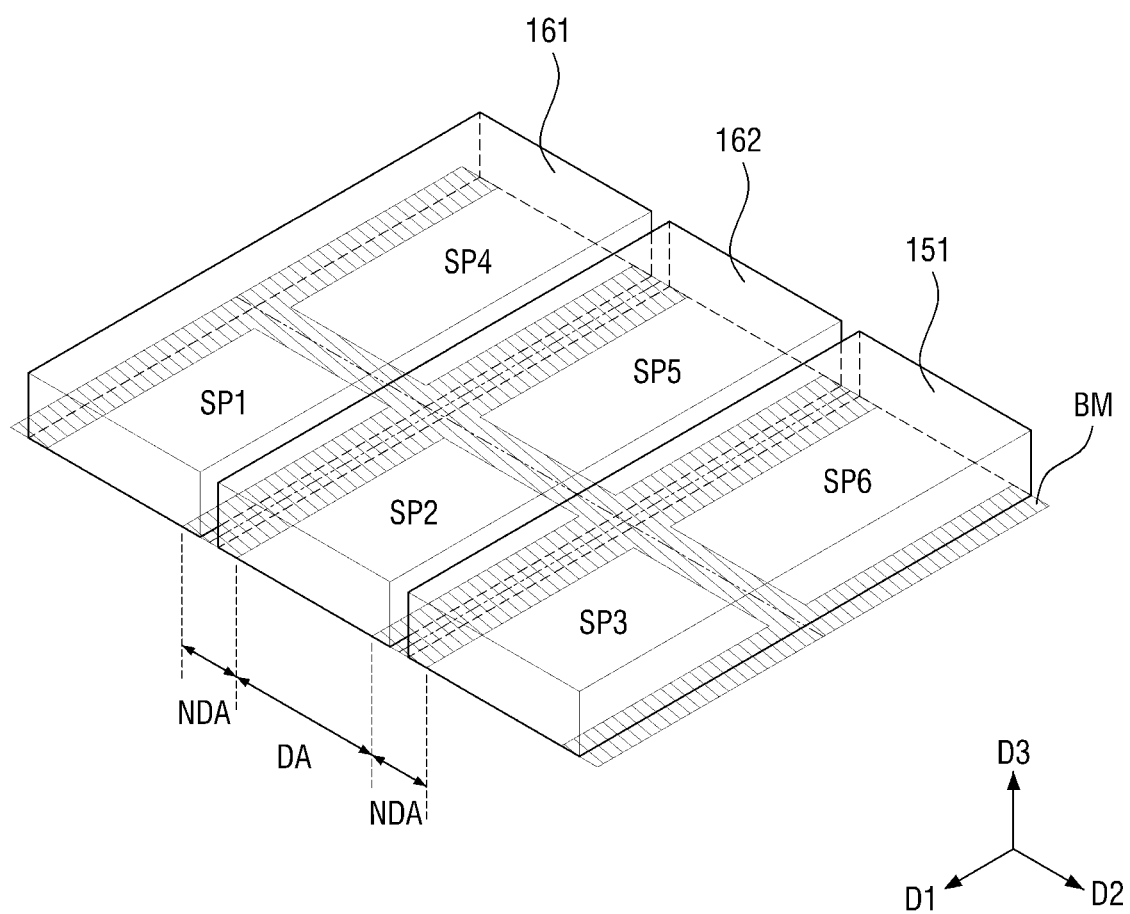
FIG. 2 is a perspective view of a light converter illustrated in FIG. 1.

FIG. 1 is a cross-sectional view of a display device according to an exemplary embodiment of the present disclosure. FIG. 2 is a perspective view of a light converter illustrated in FIG. 1.

Referring to FIG. 1, a display device 1 includes a light provider 301 and a light converter 101 receiving light from the light provider 301 and converting the wavelength or transmittance of the received light. The light provider 301 may include a light emitter or may include a light transmitter transmitting incident light. In the description that follows, it is assumed that the light provider 301 includes a light emitter having a light-emitting element.

In an embodiment, the light converter 101 may include a first substrate 111, a plurality of first and second wavelength conversion layers 161 and 162, a light-transmitting layer 151, a capping layer 181, and a plurality of first, second, and third filters 131, 132, and 182, and the first and second wavelength conversion layers 161 and 162, the light-transmitting layer 151, the capping layer 181, and the first, second, and third filters 131, 132, and 182 are disposed on the first substrate 111.

In an embodiment, the first substrate 111 may be a transparent insulating substrate comprising glass, quartz, or transparent plastic. In an exemplary embodiment, the first substrate 111 may be a flexible substrate that is bendable, foldable, or rollable.

The light converter 101 may further include a black matrix BM. The black matrix BM may be disposed on the first substrate 111. The black matrix BM may be disposed along the boundaries between a plurality of pixel units and may block the transmission of light therethrough to prevent or substantially prevent color mixing between neighboring pixel units. Referring to FIG. 2, the black matrix BM may be disposed in first and second directions D1 and D2 along the boundaries between first through sixth pixel units SP1 through SP6. An area overlapping with the black matrix BM may be defined as a non-display area NDA, and an area not overlapping with the black matrix BM may be defined as a display area DA. The black matrix BM may at least partially overlap with the first and second wavelength conversion layers 161 and 162 and the light-transmitting layer 151. That is, in a plan view, the black matrix BM may be disposed to surround the first and second wavelength conversion layers 161 and 162 and the light-transmitting layer 151. The material of the black matrix BM is not particularly limited as long as the black matrix BM can block the transmission of light applied thereto. In an exemplary embodiment, the black matrix BM may comprise an organic material or a metal material including chromium (Cr).

The first pixel unit SP1 may emit first-color light L1. The first-color light L1 may have a first wavelength band. The second pixel unit SP2 may emit second-color light L2. The second-color light L2 may have a second wavelength band. The third pixel unit SP3 may emit third-color light L3. The third-color light L3 may have a third wavelength band. The first, second, and third wavelength bands may differ from one another. In an exemplary embodiment, the central wavelength or peak wavelength of the first wavelength band may be about 600 nm to about 670 nm. Accordingly, light having the first wavelength band may be red light. In an exemplary embodiment, the peak wavelength of the second wavelength band may be about 500 nm to about 570 nm. Accordingly, light having the second wavelength band may be green light. In an exemplary embodiment, the peak wavelength of the third wavelength band may be about 420 nm to about 480 nm. Accordingly, light having the third wavelength band may be blue light.

The first and second filters 131 and 132 may be disposed on the first substrate 111. The first and second filters 131 and 132 may at least partially overlap with the black matrix BM. Referring to FIGS. 1 and 2, the first filter 131 may extend in the first direction D1 over the first and fourth pixel units SP1 and SP4 and may be arranged as a stripe. The first filter 131 may overlap with the first wavelength conversion layer 161. The first filter 131 may be interposed between the first substrate 111 and the first wavelength conversion layer 161. The first filter 131 may transmit the first-color light L1 therethrough and may absorb other-color light. The first filter 131 may be a red color filter. The second filter 132 may extend in the first direction D1 over the second and fifth pixel units SP2 and SP5 and may be arranged as a stripe. The second filter 132 may overlap with the second wavelength conversion layer 162. The second filter 132 may be interposed between the first substrate 111 and the second wavelength conversion layer 162. The second filter 132 may transmit the second-color light L2 therethrough and may absorb other-color light. The second filter 132 may be a green color filter. That is, the first and second filters 131 and 132 may prevent or substantially prevent the occurrence of color differences by transmitting only the first-color light L1 and the second-color light L2 therethrough.

In an exemplary embodiment, the first and second filters 131 and 132 may be the same or identical. That is, the first and second filters 131 and 132 may transmit the first-color light L1 and the second-color light L2 therethrough and may absorb other-color light. In an embodiment, the first and second filters 131 and 132 may be blue cutoff filters and may comprise yellow photoresist. The first and second filters 131 and 132 may be formed as single-layer films or as multilayer films.

The light-transmitting layer 151 may be disposed on the first substrate 111. Referring to FIGS. 1 and 2, the light-transmitting layer 151 may at least partially overlap with the black matrix BM. The light-transmitting layer 151 may extend in the first direction D1 between the third and sixth pixel units SP3 and SP6 and may be arranged as a stripe. The light-transmitting layer 151 may transmit light of all colors therethrough.

The light-transmitting layer 151 may comprise a third light-transmitting resin 151b and a light-scattering material 151a. For convenience, the light-scattering material 151a is illustrated as being a single particle. The light-scattering material 151a may be dispersed in the third light-transmitting resin 151b. The light-scattering material 151a may scatter light provided to the light-transmitting layer 151 and may release the scattered light. The light-scattering material 151a may scatter light in various directions, regardless of the incidence angle of the light, and may thus release light L3 of a third color. The third-color light L3 may be depolarized and may thus be in a non-polarized state. In an exemplary embodiment, the light-scattering material 151a may have a different refractive index from the third light-transmitting resin 151b. For example, the light-scattering material 151a may be any one of $TiO_2$, $ZrO_2$, $Al_2O_3$, $In_2O_3$, ZnO, $SnO_2$, $Sb_2O_3$, and indium tin oxide (ITO), but the present disclosure is not limited thereto. That is, nearly any material capable of scattering incident light may be used as the light-scattering material 151a.

A color conversion layer 160 may include the first and second wavelength conversion layers 161 and 162. The color conversion layer 160 may comprise a material capable of converting or shifting the wavelength of light provided thereto. Accordingly, the color conversion layer 160 may change the color of light incident thereupon. The color conversion layer 160 may include the first and second wavelength conversion layers 161 and 162. The color conversion layer 160 will be described further later with reference to FIGS. 1 and 2.

The first wavelength conversion layer 161 may extend in the first direction D1 to overlap with the first filter 131 and may be arranged as a stripe. The first filter 131 may be interposed between the first wavelength conversion layer 161 and the first substrate 111. The first wavelength conversion layer 161 may overlap with the first and fourth pixel units SP1 and SP4. The first wavelength conversion layer 161 may receive third-color light L3 having the third wavelength band from the light provider 301, may convert or shift the central wavelength of the third-color light L3, and may emit the wavelength-converted light. The light emitted by the first wavelength conversion layer 161 may be first-color light L1 having the first wavelength band. In an embodiment, the first wavelength conversion layer 161 may receive blue light from the light provider 301 and may transform the blue light into red light.

The first wavelength conversion layer 161 may comprise a first wavelength conversion material 161a and a first light-transmitting resin 161b.

The first wavelength conversion material 161a may be a material transforming third-color light L3 having the third wavelength band into first-color light L1 having the first wavelength band. For convenience, the first wavelength conversion material 161a is illustrated as being a single particle. Although not specifically illustrated, the first wavelength conversion material 161a may comprise, for example, first quantum dots. The particle size of the first quantum dots is not particularly limited as long as the first wavelength conversion material 161a can properly transform third-color light L3 having the third wavelength band into first-color light L1 having the first wavelength band.

In an embodiment, the first quantum dots may have a core-shell structure, and the core of each of the first quantum dots may comprise a semiconductor nanocrystal material. In an exemplary embodiment, the semiconductor nanocrystal material may be selected from among a Group II-VI compound, a Group III-V compound, a Group IV-VI compound, a Group IV element, a Group IV compound, and a combination thereof.

The Group II-VI compound may be selected from the group consisting of: a binary compound such as CdSe, CdTe, ZnS, ZnSe, ZnTe, ZnO, HgS, HgSe, HgTe, MgSe, MgS, or a mixture thereof; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a mixture thereof; and a quaternary compound, such as HgZnTeS, CdZnSeS, CdZnSeTe, CdZnSTe, CdHgSeS, CdHgSeTe, CdHgSTe, HgZnSeS, HgZnSeTe, HgZnSTe, or a mixture thereof.

The Group III-V compound may be selected from the group consisting of: a binary compound, such as GaN, GaP, GaAs, GaSb, AlN, AlP, AlAs, AlSb, InN, InP, InAs, InSb, or a mixture thereof; a ternary compound, such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a mixture thereof; and a quaternary compound, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof.

The Group IV-VI compound may be selected from the group consisting of: a binary compound, such as SnS, SnSe, SnTe, PbS, PbSe, PbTe, or a mixture thereof; a ternary compound, such as SnSeS, SnSeTe, SnSTe, PbSeS, PbSeTe, PbSTe, SnPbS, SnPbSe, SnPbTe, or a mixture thereof; and a quaternary compound, such as SnPbSSe, SnPbSeTe, SnPbSTe, or a mixture thereof. The Group IV element may be selected from the group consisting of Si, Ge, and a mixture thereof. The Group IV compound may be a binary compound selected from the group consisting of SiC, SiGe, and a mixture thereof.

Herein, the binary compound, the ternary compound, or the quaternary compound may be present in the form of particles in a substantially uniform concentration, or may be present in the form of particles having different concentration distributions. A core-shell structure in which one first quantum dot is surrounded by another first quantum dot may be provided. At the interface between the core and shell of each of the first quantum dots, an element present in the shell of each of the first quantum dots may have a concentration gradient that gradually decreases in a direction from the surface to the center of each of the first quantum dots.

The first wavelength conversion material 161a may be dispersed naturally in the first light-transmitting resin 161b. The material of the first light-transmitting resin 161b is not particularly limited as long as it does not affect the wavelength conversion performance of the first wavelength conversion material 161a and is transparent, not to the extent that light absorption is caused. For example, the first light-transmitting resin 161b may comprise an organic material, such as an epoxy resin, an acrylic resin, or the like.

The second wavelength conversion layer 162 may comprise a second wavelength conversion material 162a and a second light-transmitting resin 162b.

The second wavelength conversion layer 162 may extend in the first direction D1 to overlap with the second filter 132 and may be arranged as a stripe. The second filter 132 may be interposed between the second wavelength conversion layer 162 and the first substrate 111. The second wavelength conversion layer 162 may overlap with the second and fifth pixel units SP2 and SP5. The second wavelength conversion layer 162 may receive third-color light L3 having the third wavelength band from the light provider 301, may convert or shift the central wavelength of the third-color light L3, and may emit the wavelength-converted light. The light emitted by the second wavelength conversion layer 162 may be second-color light L2 having the second wavelength band. In an embodiment, the second wavelength conversion layer 162 may receive blue light from the light provider 301 and may transform the blue light into green light.

The sides of the second wavelength conversion layer 162 may be spaced apart from the sides of the first wavelength conversion layer 161. Since the first and second wavelength conversion layers 161 and 162 are spaced apart from each other, the mixing of light emitted by the first wavelength conversion material 161a of the first wavelength conversion layer 161 and light emitted by the second wavelength conversion material 162a of the second wavelength conversion layer 162 can be prevented, or at least alleviated.

The second wavelength conversion layer 162 may comprise a second wavelength conversion material 162a and a second light-transmitting resin 162b. The second wavelength conversion material 162a may be a material transforming third-color light L3 having the third wavelength band into second-color light L2 having the second wavelength band. For convenience, the second wavelength conversion material 162a is illustrated as being a single particle. Although not specifically illustrated, the second wavelength conversion material 162a may comprise, for example, second quantum dots. The particle size of the second quantum dots is not particularly limited as long as the second wavelength conversion material 162a can properly transform third-color light L3 having the third wavelength band into second-color light L2 having the second wavelength band. In an embodiment, the second quantum dots may have a core-shell structure, and the core of each of the second quantum dots may comprise a semiconductor nanocrystal material. In an exemplary embodiment, the semiconductor nanocrystal material may be selected from among a Group II-VI compound, a Group III-V compound, a Group IV-VI compound, a Group IV element, a Group IV compound, and a combination thereof. Examples of the Group II-VI compound, the Group III-V compound, the Group IV-VI compound, the Group IV element, and the Group IV compound may be as described above with regard to the first quantum dots, and, thus, further detailed descriptions thereof will be omitted.

The second wavelength conversion material 162a may be dispersed naturally in the second light-transmitting resin 162b. The material of the second light-transmitting resin 162b is not particularly limited as long as it does not affect the wavelength conversion performance of the first wavelength conversion material 161a and is transparent, not to the extent that light absorption is caused. For example, the second light-transmitting resin 162b may comprise an organic material, such as an epoxy resin, an acrylic resin, or the like. In an exemplary embodiment, the first, second, and third light-transmitting resins 161b, 162b, and 151b may all be formed of the same material, but the present disclosure is not limited thereto.

In an embodiment, the full width at half maximum (FWHM) of the emission spectrum of the first quantum dots and the second quantum dots may be about 45 nm or less, and, in an embodiment, about 40 nm, and, in an embodiment, about 30 nm, in which case, color purity or color reproducibility can be improved. Since light is emitted through the first quantum dots and the second quantum dots in all directions, a viewing angle can be further widened.

In an exemplary embodiment, the particle size of the first quantum dots may be greater than the particle size of the second quantum dots. In an embodiment, for example, the first quantum dots may have a particle size of about 55 Å to 65 Å, and the second quantum dots may have a particle size of about 40 Å to 50 Å. Light emitted by the first quantum dots and the second quantum dots propagates in various directions regardless of the incidence angle of incident light.

In an exemplary embodiment, the first quantum dots and the second quantum dots may be formed as spherical, pyramid-shaped, multi-arm, or cubic nanoparticles, nanotubes, nanowires, nanofibers, or nano-plate particles.

First-color light L1 having the first wavelength band, emitted by the first wavelength conversion layer 161, and second-color light L2 having the second wavelength band, emitted by the second wavelength conversion layer 162, may be in an unpolarized state. As used herein, the term "unpolarized light" refers to light not consisting only of polarization components in a particular direction, i.e., light not polarized only in the particular direction but randomly polarized. Examples of unpolarized light include natural light.

In another exemplary embodiment, each of the first and second wavelength conversion layers 161 and 162 may comprise fluorescent materials, quantum rods, or phosphors, instead of quantum dots. In an embodiment, the fluorescent materials may have a particle size of, for example, about 100 nm to 3000 nm, and may include yellow, green, and red fluorescent materials.

The third filter 182 may be disposed between the color conversion layer 160 and the light-transmitting layer 151. The third filter 182 may be formed between the first wavelength conversion layer 161, the second wavelength conversion layer 162, and the light-transmitting layer 151 to prevent the first wavelength conversion layer 161, the second wavelength conversion layer 162, and the light-transmitting layer 151 from being in contact with one another. In an embodiment, the third filter 182 may cover not only the display area DA, but also the entire non-display area NDA overlapping with the black matrix BM. Accordingly, color mixing can be prevented or substantially prevented between the first wavelength conversion layer 161, the second wavelength conversion layer 162, and the light-transmitting layer 151.

The third filter 182 may be formed as a single-layer film or a multilayer film. In an exemplary embodiment, in a case in which the third filter 182 is formed as a multilayer film, the third filter 182 may include a silicon nitride (SiNx) layer and a silicon oxide (SiOx) layer that are alternately stacked. In an embodiment, the third filter 182 may further include a capping layer 181 formed of silicon nitride and may thus protect the color conversion layer 160 and the light-transmitting layer 151.

In an exemplary embodiment, the third filter 182 may have an average thickness of about 0.5 μm to 2 μm, or about 1 μm. Since the capping layer 181 and the third filter 182 are formed on the color conversion layer 160 and the light-transmitting layer 151, the capping layer 181 and the third filter 182 may be formed conforming to the shapes of the color conversion layer 160 and the light-transmitting layer 151.

The third filter 182 may transmit light of a particular wavelength band therethrough and may reflect light of other wavelength bands. In an embodiment, the central wavelength of light reflected by the third filter 182 may be longer than the central wavelength of light transmitted through the third filter 182. That is, the third filter 182 may selectively transmit third-color light L3 having the third wavelength band therethrough and may reflect first-color light L1 having the first wavelength band, which includes longer wavelengths than the third wavelength band, and second-color light L2 having the second wavelength band, which also includes longer wavelengths than the third wavelength band. Thus, the third filter 182 may selectively transmit blue light therethrough and may reflect red light and green light. In an embodiment, the third filter 182 may be a yellow recycling filter (YRF).

The third filter 182 may recycle first-color light L1 having the first wavelength band, emitted from the first wavelength conversion layer 161 toward a second substrate 310, back to the first substrate 111, thereby improving the efficiency of emission. Also, the third filter 182 may transmit third-color light L3 having the third wavelength band, provided by the light provider 301, and may reflect light having a longer central wavelength than the third-color light L3, thereby improving the color purity of the third-color light L3.

Figure 3:
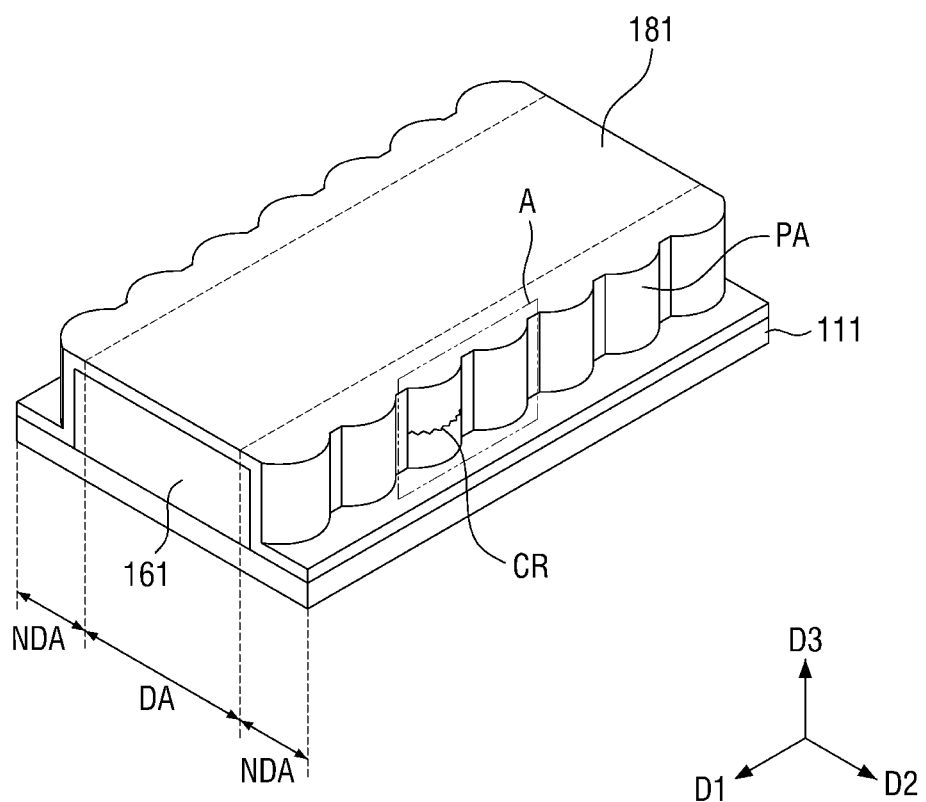
FIG. 3 is a perspective view illustrating a first wavelength conversion layer of the light converter of FIG. 2.

Although not specifically illustrated in FIG. 1, the sides of each of the first wavelength conversion layer 161, the second wavelength conversion layer 162, and the light-transmitting layer 151 may include uneven patterns (PA in FIG. 3). Cracks CR may be formed in the capping layer 181 and the third filter 182, starting from the uneven patterns PA on the sides of each of the first wavelength conversion layer 161, the second wavelength conversion layer 162, and the light-transmitting layer 151. In a case in which the cracks CR are formed on the capping layer 180, the third filter 182 may at least partially fill the cracks CR. The cracks CR may become passages through which the gases remaining in the color conversion layer 160 and the light-transmitting layer 151 are released. The cracks CR may be formed all over the first, second, and third pixel units SP1, SP2, and SP3. In an embodiment, the cracks CR may be formed in the non-display area NDA overlapping with the black matrix BM. In an embodiment, the cracks CR may be formed as fine slits or may be formed as trenches. That is, the cracks CR may be formed in any of various shapes, but the shape of the cracks CR is not particularly limited as long as the cracks CR can properly release the gases remaining in the first wavelength conversion layer 161, the second wavelength conversion layer 162, and the light-transmitting layer 151. Various types of cracks CR will be described later with reference to FIGS. 3 through 8.

The light provider 301 provides light to the light converter 101. The light provider 301 may be disposed below the light converter 101 and may provide light having a particular wavelength band to the light converter 101. The light provider 301 may include first, second, and third pixel electrode units PE1, PE2, and PE3. The first pixel electrode unit PE1 may be a part of the light provider 301 that overlaps with the first pixel unit SP1. The second pixel electrode unit PE2 may be a part of the light provider 301 that overlaps with the second pixel unit SP2. The third pixel electrode unit PE3 may be a part of the light provider 301 that overlaps with the third pixel unit SP3. That is, the first, second, and third pixel electrode units PE1, PE2, and PE3 may provide light to the first, second, and third pixel units SP1, SP2, and SP3, respectively. Light provided from the light provider 301 to the light converter 101 may be third-color light L3 having the third wavelength band. The light provider 301 may provide blue light to the light converter 101. The light converter 101 is disposed on the optical path of the third-color light L3 emitted from the light provider 301 and displays an image based on the third-color light L3 provided by the light provider 301. The arrangement of the light converter 101 and the light provider 301 is not particularly limited as long as the light converter 101 is disposed on the optical path of light emitted from the light provider 301.

In an embodiment, the light provider 301 may include the second substrate 310, first electrodes 320, a pixel-defining film 330, a first auxiliary layer 340, an emission layer 350, a second auxiliary layer 360, a second electrode 370, and an encapsulation layer 380. The first electrodes 320, the pixel-defining film 330, the first auxiliary layer 340, the emission layer 350, the second auxiliary layer 360, the second electrode 370, and the encapsulation layer 380 may be sequentially stacked on the second substrate 310, but the present disclosure is not limited thereto.

In an exemplary embodiment, the second substrate 310 may be a transparent insulating substrate comprising glass, quartz, or transparent plastic. In an exemplary embodiment, the second substrate 310 may be a flexible substrate that is bendable, foldable, or rollable.

The first electrodes 320 may be disposed on the second substrate 310. The first electrodes 320 may be pixel electrodes. The first electrodes 320 may overlap with the pixel units and may be spaced apart from one another. The first electrodes 320 may be anodes. That is, the first electrodes 320 may provide holes to the emission layer 350.

In a non-limiting example, the first electrodes 320 may have a stack of a high-work function material layer comprising ITO, indium zinc oxide (IZO), zinc oxide (ZnO), indium oxide ($In_2O_3$), and a reflective material layer comprising silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof. In a non-limiting example, the first electrodes 320 may have a multilayer structure such as ITO/Mg, ITO/MgF, ITO/Ag, or ITO/Al/ITO.

The pixel-defining film 330 may be disposed on the second substrate 310. The pixel-defining film 330 may include openings exposing the first electrodes 320 therethrough. The openings may be formed to overlap with the pixel units and may be spaced apart from one another. That is, the pixel-defining film 330 may be disposed to include the boundaries between the pixel units.

The pixel-defining film 330 may comprise an inorganic insulating material, such as silicon oxide, silicon nitride, silicon oxynitride, hafnium oxide, aluminum oxide, titanium oxide, tantalum oxide, or zinc oxide, or an organic insulating material such as an acrylic resin, an epoxy resin, a phenolic resin, a polyamide resin, a polyimide resin, an unsaturated polyester resin, a polyphenylene resin, or benzocyclobutene (BCB). The pixel-defining film 330 may be a single-layer film or a multilayer film consisting of different materials.

The first auxiliary layer 340, the emission layer 350, and the second auxiliary layer 360 may be disposed in each of the openings of the pixel-defining film 330.

The first auxiliary layer 340, the emission layer 350, and the second auxiliary layer 360 may be sequentially disposed on the second substrate 310. The first auxiliary layer 340 may include a hole transport layer (HTL) delivering holes injected from the first electrodes 320. The first auxiliary layer 340 may further include a hole injection layer (HIL) between the second substrate 310 and the HTL. The second auxiliary layer 360 may include an electron transport layer (ETL) delivering electrons injected from the second electrode 370. The second auxiliary layer 360 may further include an electron injection layer (EIL) between the second electrode 370 and the ETL.

The emission layer 350 may be disposed between the first and second auxiliary layers 340 and 360. The emission layer 350 may include an organic light-emitting layer. The holes delivered by the first auxiliary layer 340 and the electrons delivered by the second auxiliary layer 360 may combine with each other in the organic light-emitting layer, thereby generating excitons and emitting light. The emitted light may be third-color light L3 having the third wavelength band. In an embodiment, the organic light-emitting layer may emit blue light. The material of the organic light-emitting layer is not particularly limited as long as the organic light-emitting layer 350 can emit third-color light L3 having the third wavelength band.

In an exemplary embodiment, the emission layer 350 may include a plurality of organic light-emitting layers. Charge generation layers (CGLs) may be disposed between the plurality of organic light-emitting layers. Although not specifically illustrated, multiple CGLs may be provided and may include an electron generation layer (EGL) disposed adjacent to the first electrodes 320 and a hole generation layer (HGL) disposed adjacent to the second electrode 370.

The second electrode 370 may be disposed on the pixel-defining film 330 and the second auxiliary layer 360. The second electrode 370 may be a common electrode. In an embodiment, the second electrode 370 may be disposed on the entire second substrate 310. The second electrode 370 may include a low-work function material layer comprising Li, Ca, LiF/Ca, LiF/Al, Al, Mg, Ag, Pt, Pb, Ni, Au Nd, Ir, Cr, BaF, Ba, or a compound or mixture thereof (such as the mixture of Ag and Mg). The second electrode 370 may further include a transparent metal oxide layer disposed on the low-work function material layer.

The encapsulation layer 380 may be disposed on the second electrode 370. The encapsulation layer 380 may prevent or substantially prevent the emission layer 350 from being in contact with external moisture or oxygen. The encapsulation layer 380 may cover the first, second, and third pixel electrode units PE1, PE2, and PE3. The encapsulation layer 380 may be a single-layer film or may be a multilayer film in which an organic film and an inorganic film are alternately stacked.

In an embodiment, an adhesive member 201 may be disposed between the light converter 101 and the light provider 301. The adhesive member 201 may transmit light provided by the light provider 301 therethrough. The adhesive member 201 may be formed of a material with high light transmittance. In an embodiment, the adhesive member 201 may comprise an adhesive material such as an optically clear resin (OCR) or an optically clear adhesive (OCA). The material of the adhesive member 201 is not particularly limited as long as it has high light transmittance.

FIG. 3 is a perspective view illustrating the first wavelength conversion layer 161 of the light converter 101 of FIG. 2. The first wavelength conversion layer 161 may have surfaces parallel to the first substrate 111 and sides including the uneven patterns PA. For convenience, the first and third filters 131 and 182 are not illustrated in FIG. 3. The structure of the first wavelength conversion layer 161 will herein be described, but the description of the first wavelength conversion layer 161 may be directly applicable to the second wavelength conversion layer 162 and the light-transmitting layer 151.

Referring to FIG. 3, uncured solvent ingredients may remain in the first wavelength conversion layer 161 and may cause gases to be formed in the first wavelength conversion layer 161. In a case in which gases remain in the first wavelength conversion layer 161, the gases may form an empty space in the first wavelength conversion layer 161. That is, a space where the first light-transmitting resin 161b and the first wavelength conversion material 161a do not exist may be formed in the first wavelength conversion layer 161, and this space may cause a serious defect, such as an active unfilled area (AUA) phenomenon in the display device 1. Thus, it is desired that the gases remaining in the first wavelength conversion layer 161 be released. The gases remaining in the first wavelength conversion layer 161 may be released by forming vent holes in the light converter 101. However, since the formation of such vent holes requires an additional photolithography process, the manufacturing cost of the display device 1 increases, and it takes time to form such vent holes. Also, the gases remaining in the first wavelength conversion layer 161 can be released by performing baking at a temperature of 180° C. or higher, in which case, however, the emission efficiency of the first wavelength conversion layer 161 may decrease. Thus, it is desired to minimize or reduce baking to obtain a display device with a high emission efficiency.

In an embodiment, the capping layer 181 may have multiple cracks CR. In an embodiment, the cracks CR may be formed on the capping layer 181 by applying physical impact to the light converter 101 through, for example, ultrasonic cleaning. Ultrasonic cleaning may cause vibration and taps to the capping layer 181. Once the cracks CR are formed on the capping layer 181, the cracks CR may serve as a passage through which the gases remaining in the first wavelength conversion layer 161 are released. However, the type of method to form the cracks CR on the capping layer 181 is not limited to applying physical impact through ultrasonic cleaning, and nearly any method can be used as long as it can properly form the cracks CR on the capping layer 181. For example, thermal treatment or chemical treatment may be used to form the cracks CR on the capping layer 181.

The cracks CR may penetrate the capping layer 181 in a thickness direction perpendicular to the sides of the first wavelength conversion layer 161. That is, the sides of the first wavelength conversion layer 161 where the cracks CR are formed may not be covered by the capping layer 181, but may be exposed. The cracks CR may be formed all over the capping layer 181 that overlaps with the first wavelength conversion layer 161. That is, the cracks CR may be formed in both the display area DA and the non-display area NDA. If the cracks CR are formed in the display area DA, the size of the cracks CR may increase. Also, the cracks CR formed in the display area DA may lower the optical efficiency of the display device 1. If the cracks CR are formed in the non-display area NDA overlapping with the black matrix BM, any decrease in the optical efficiency of the display device 1, caused by the cracks CR, can be minimized or reduced because the cracks CR are covered by the black matrix BM.

Thus, the uneven patterns PA are formed on the sides of the first wavelength conversion layer 161 in order to induce the cracks CR to be formed at desired locations. In a plan view, the uneven patterns PA may include protruding parts that are outwardly projected and recessed parts that are recessed as compared to the protruding parts. The sides of the first wavelength conversion layer 161 may be formed to overlap with the black matrix BM, i.e. the non-display area NDA, and the uneven patterns PA may be formed to overlap with the non-display area NDA. The size of the uneven patterns PA may be defined as the distance by which the uneven patterns PA protrude from the sides of the first wavelength conversion layer 161. The size of the uneven patterns PA may be smaller than the width of the black matrix BM. In an exemplary embodiment, the size of the uneven patterns PA may be smaller than 50 µm. The shape of the uneven patterns PA is not particularly limited as long as the uneven patterns PA are projected from the first wavelength conversion layer 161. The uneven patterns PA will be described further later with reference to FIGS. 13 through 18. In a case in which the uneven patterns PA are formed on the sides of the first wavelength conversion layer 161, the cracks CR may be formed on the capping layer 181, starting from the uneven patterns PA. That is, edges of the uneven patterns PA may receive more stress than other parts of the uneven patterns PA.

FIGS. 4 through 8 are enlarged views illustrating a region "A" in FIG. 3.

Figure 4:
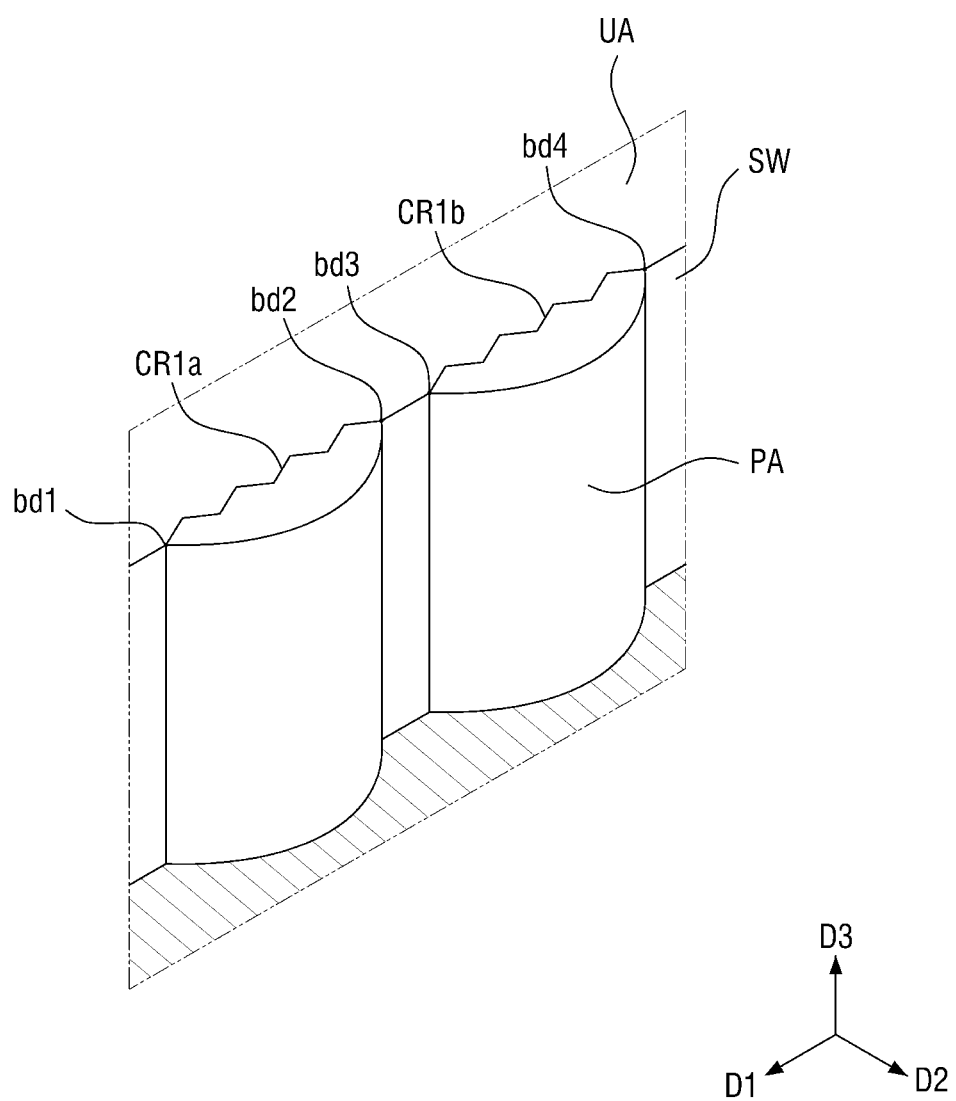
FIGS. 4 through 8 are enlarged views illustrating a region "A" in FIG. 3.

Referring to FIG. 4, the capping layer 181 may include first and second cracks CR1a and CR1b formed on a surface UA of the capping layer 181 between edges, bd1, bd2, bd3, and bd4 of the uneven patterns PA. The first and second cracks CR1a and CR1b may overlap with the non-display area NDA and may be formed on the surface UA of the capping layer 181 along the first direction D1. When physical impact is applied to the capping layer 181 through, for example, ultrasonic cleaning, the edges bd1, bd2, bd3, and bd4 receive more stress from other parts of the uneven patterns PA, and, as a result, the first and second cracks CR1a and CR1b may be formed. The first and second cracks CR1a and CR1b may become passages through which the gases remaining in the first wavelength conversion layer 161 are released. By using the uneven patterns PA, the first and second cracks CR1a and CR1b can be induced to be formed in the non-display area NDA overlapping with the black matrix BM. Descriptions of elements or features that have already been described above with reference to FIG. 4 will not be repeated.

Figure 5:
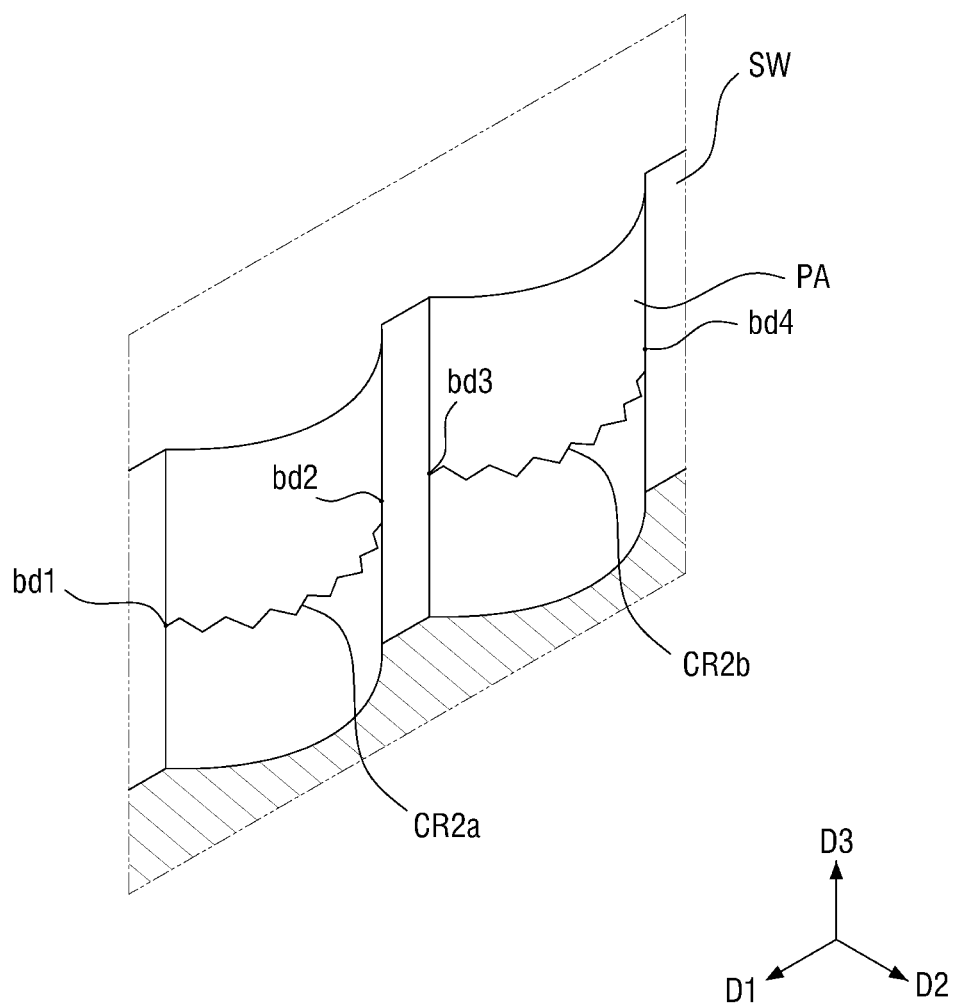

Referring to FIG. 5, the capping layer 181 may include first and second cracks CR2a and CR2b formed on the sides of the capping layer 181 overlapping with the sides of the first wavelength conversion layer 161. The first and second cracks CR2a and CR2b may overlap with the non-display area NDA and may be disposed on protruding parts of the uneven patterns PA. FIG. 5 illustrates an example in which the first and second cracks CR2a and CR2b are formed in parallel to the first substrate 111 along the first direction D1, starting from edges bd1, bd2, bd3, and bd4 of the uneven patterns PA, but the present disclosure is not limited to this example. Also, the distance between the first and second cracks CR2a and CR2b and the first substrate 111 is not particularly limited as long as the first and second cracks CR2a and CR2b can properly serve as passages through which the gases remaining in the first wavelength conversion layer 161 are released. Referring to FIG. 5, in an embodiment, the first crack CR2a may be closer than the second crack CR2b to the first substrate 111. By using the uneven patterns PA, the first and second cracks CR2a and CR2b can be induced to be formed in the non-display area NDA overlapping with the black matrix BM.

Figure 6:
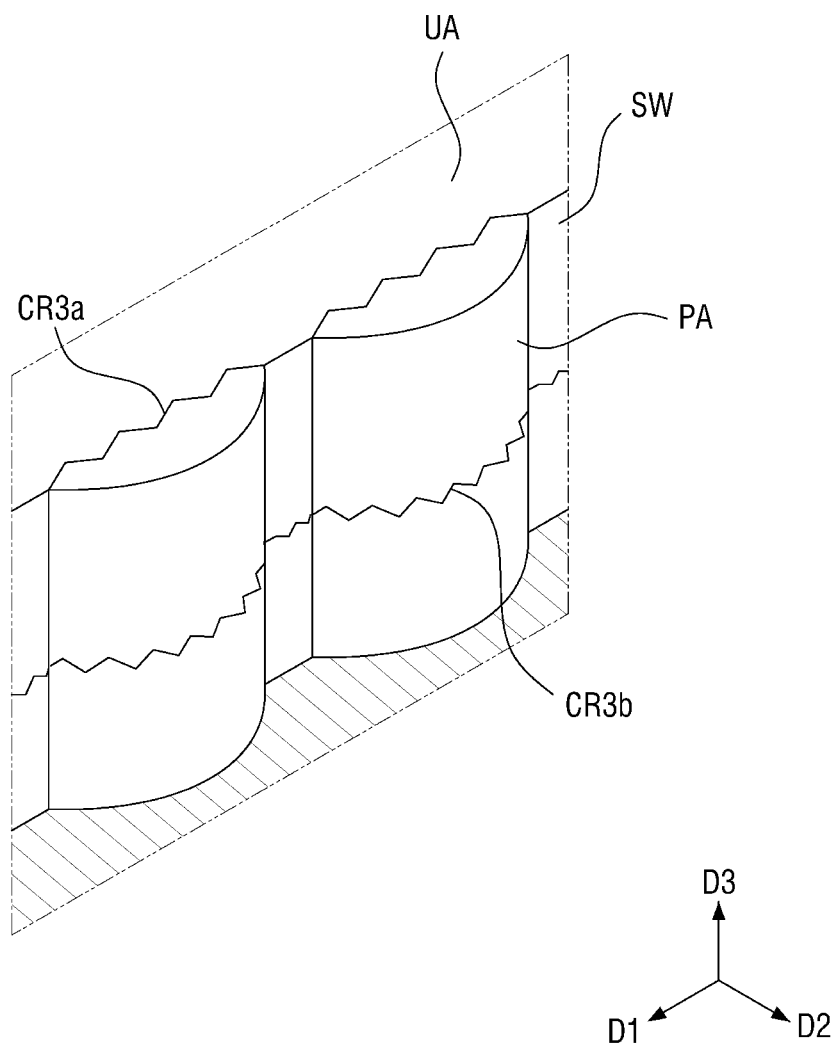

Referring to FIG. 6, the capping layer 181 may include first and second cracks CR3a and CR3b overlapping with multiple uneven patterns PA. The first and second cracks CR3a and CR3b may overlap with the non-display area NDA and may extend in the first direction D1 over the surface UA or a side SW of the capping layer 181. The first crack CR3a formed on the surface UA of the capping layer 181 may be a crack connecting the first and second cracks CR1a and CR1b of FIG. 4. The second crack CR3b formed on the side SW of the capping layer 181 may be a crack connecting the first and second cracks CR2a and CR2b of FIG. 5. The first and second cracks CR3a and CR3b, which are formed across multiple uneven patterns PA along the first direction D1, can effectively release the gases remaining in the first wavelength conversion layer 161, as compared to cracks formed across only one uneven pattern PA, as illustrated in FIG. 4 or 5.

Figure 7:
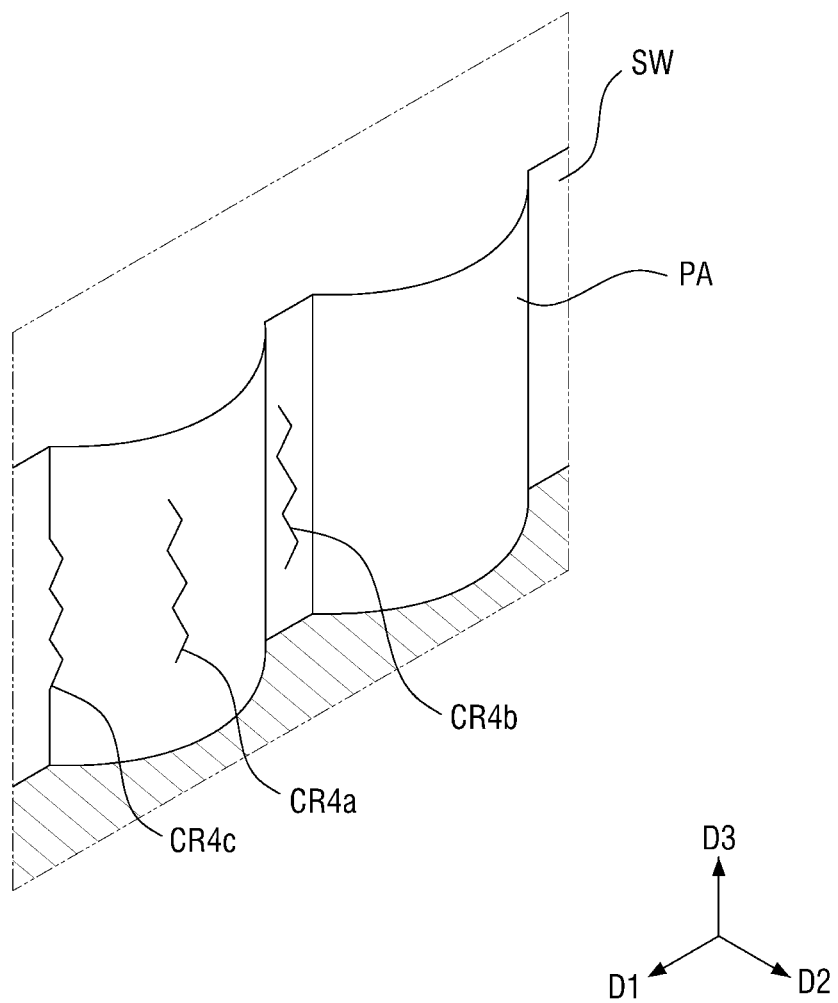

Referring to FIG. 7, the capping layer 181 may include first, second, and third cracks CR4a, CR4b, and CR4c formed in a third direction D3 perpendicular to the first substrate 111. The first, second, and third cracks CR4a, CR4b, and CR4c may overlap with the non-display area NDA and may be formed on the side SW of the capping layer 181. The distances between the first, second, and third cracks CR4a, CR4b, and CR4c are not particularly limited as long as the first, second, and third cracks CR4a, CR4b, and CR4c can properly serve as passages through which the gases remaining in the first wavelength conversion layer 161 are released. The first crack CR4a may be formed to overlap with a protruding part of an uneven pattern PA, the second crack CR4b may be formed to overlap with a recessed part of the uneven pattern PA, and the third crack CR4c may be formed to overlap with an edge of the uneven pattern PA.

Figure 8:
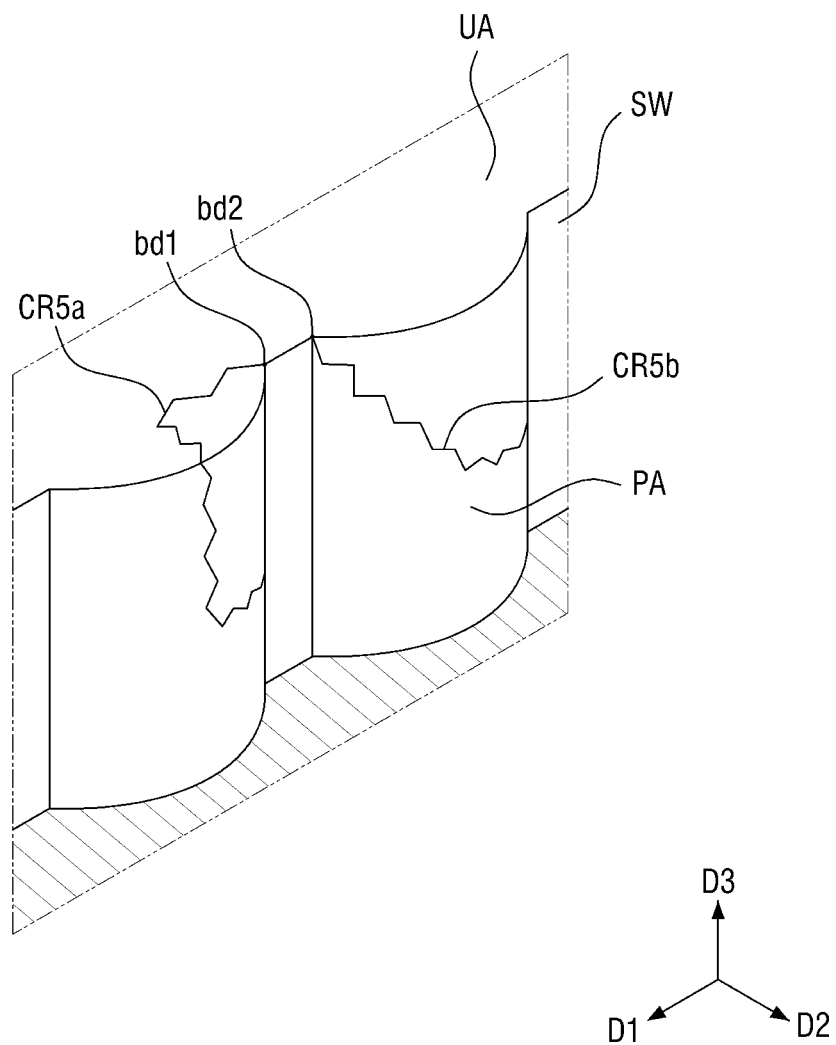

Referring to FIG. 8, the capping layer 181 may include first and second cracks CR5a and CR5b, and the first and second cracks CR5a and CR5b may be combinations of various types of cracks that have been described above with reference to FIGS. 4 through 7. The first and second cracks CR5a and CR5b overlap with the non-display area NDA. The first crack CR5a may be a crack connecting a crack formed on the surface UA of the capping layer 181, starting from an edge bd1 of an uneven pattern PA, a crack formed in a direction perpendicular to the first substrate 111 to overlap with a protruding part of the uneven pattern PA, and a crack formed in a horizontal direction to overlap with the uneven pattern PA. The second crack CR5b may be a crack connecting a crack starting from an edge bd2 of another uneven pattern PA and overlapping with the other uneven pattern PA in a diagonal direction with respect to the first substrate 111 and a crack formed in the horizontal direction not to overlap with the other uneven pattern PA. The shape of the first and second cracks CR5a and CR5b is not particularly limited as long as the first and second cracks CR5a and CR5b can properly release the gases remaining in the first wavelength conversion layer 161.

Figure 9:
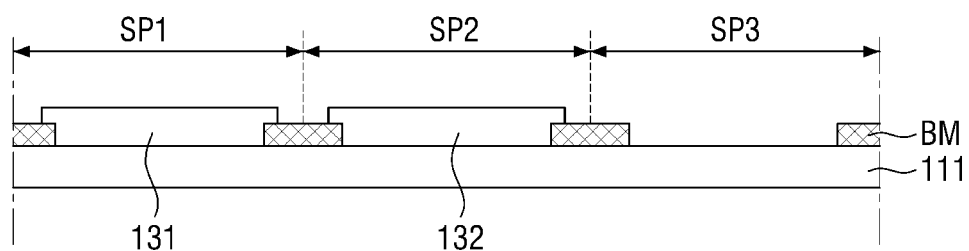
FIGS. 9 through 11 are cross-sectional views illustrating a method of fabricating a display device according to an exemplary embodiment of the present disclosure.
Figure 10:
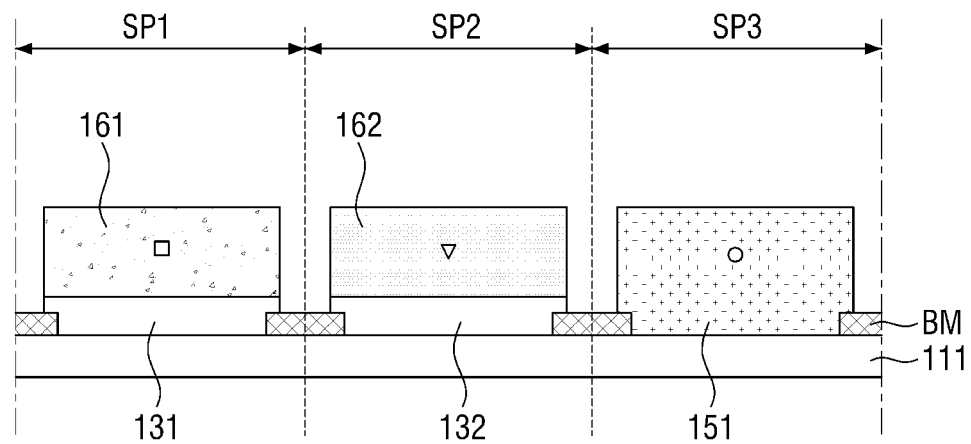
Figure 11:
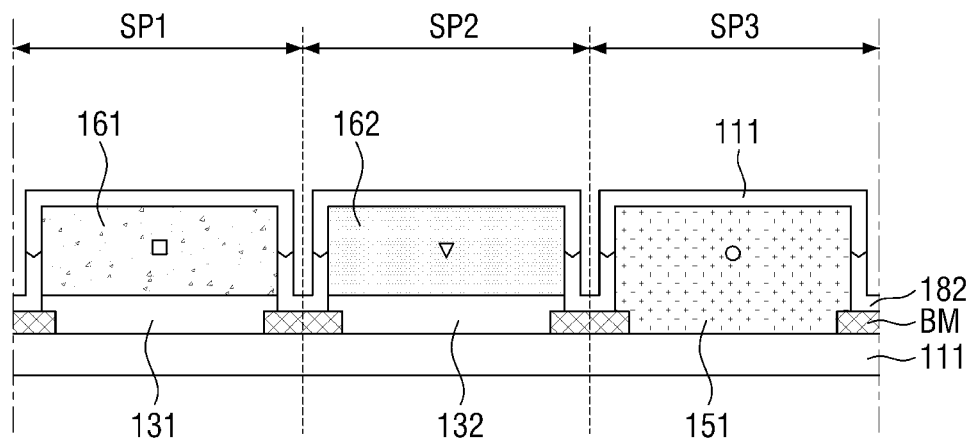

A method of fabricating the light converter 101 of the display device 1 will herein be described with reference to FIGS. 9 through 11. FIGS. 9 through 11 are cross-sectional views illustrating a method of manufacturing a display device according to an exemplary embodiment of the present disclosure. Descriptions of elements or features that have already been described above with reference to FIGS. 1 through 3 will not be repeated.

Referring to FIG. 9, in an embodiment, the black matrix BM, the first filter 131, and the second filter 132 are formed (e.g., sequentially formed) on the first substrate 111. The black matrix BM may be formed on the first substrate 111 to include a plurality of openings. The openings of the black matrix BM may correspond to the display area DA. The first and second filters 131 and 132 may be disposed on the black matrix BM. The first filter 131 may be formed on the first pixel unit SP1, and the second filter 132 may be formed on the second pixel unit SP2. The first and second filters 131 and 132 may be formed not to overlap with the third pixel unit SP3. In an exemplary embodiment, the first and second filters 131 and 132 may be formed by applying a photosensitive organic material on the entire black matrix BM and on the entire first substrate 111 and patterning the photosensitive organic material so as to leave the photosensitive organic material only in areas vertically overlapping with the first and second pixel units SP1 and SP2.

Thereafter, referring to FIG. 10, the light-transmitting layer 151, the first wavelength conversion layer 161, and the second wavelength conversion layer 162 are formed on the first filter 131, the second filter 132, the black matrix BM, and the first substrate 111. The light-transmitting layer 151 may not overlap with the first and second filters 131 and 132. The order in which the light-transmitting layer 151, the first wavelength conversion layer 161, and the second wavelength conversion layer 162 are formed is not particularly limited. The light-transmitting layer 151, the first wavelength conversion layer 161, and the second wavelength conversion layer 162 may be formed as stripes, but the present disclosure is not limited thereto. That is, in one or more embodiments, the light-transmitting layer 151, the first wavelength conversion layer 161, and the second wavelength conversion layer 162 may be formed in any of various patterns, such as a mosaic, PenTile, or S-stripe pattern. Each of the light-transmitting layer 151, the first wavelength conversion layer 161, and the second wavelength conversion layer 162 may be formed to include uneven patterns PA.

The light-transmitting layer 151 may be formed by laminating a material comprising the light-scattering material 151a, which scatters incident light, on a transparent organic material or transparent photoresist and patterning the laminated material so as to leave only parts of the laminated material including the uneven patterns PA in an area vertically overlapping with the third pixel unit SP3. In an exemplary embodiment, the light-transmitting layer 151 may include the light-scattering material 151a, which can scatter light, and the third light-transmitting resin 151b, in which the light-scattering material 151a is dispersed.

The first wavelength conversion layer 161 may be formed by laminating a material comprising a plurality of first quantum dots on a transparent organic material or transparent photoresist and patterning the laminated material so as to leave parts of the laminated material including the uneven patterns PA in the area vertically overlapping with the first pixel unit SP1.

The second wavelength conversion layer 162 may be formed by laminating a material comprising a plurality of second quantum dots on a transparent organic material or transparent photoresist and patterning the laminated material so as to leave parts of the laminated material including the uneven patterns PA in the area vertically overlapping with the second pixel unit SP2.

Thereafter, referring to FIG. 11, after the formation of the light-transmitting layer 151, the first wavelength conversion layer 161, and the second wavelength conversion layer 162, the third filter 182 may be formed on the light-transmitting layer 151, the first wavelength conversion layer 161, and the second wavelength conversion layer 162. The third filter 182 may be formed as a single-layer film or as a multilayer film. In a case in which the third filter 182 is formed as a multilayer film, the wavelength band of light that the third filter 182 transmits therethrough or reflects can be controlled by controlling the material, the refractive index, and the thickness of each layer of the third filter 182. Although not specifically illustrated, the third filter 182 may further include the capping layer 181. In a case in which the third filter 182 further includes the capping layer 181, the light-transmitting layer 151, the capping layer 181 is formed on the first wavelength conversion layer 161, and the second wavelength conversion layer 162, and the third filter 182 is formed on the capping layer 181. In an exemplary embodiment, a silicon nitride (SiNx) layer and a silicon oxide (SiOx) layer may be alternately stacked in the third filter 182. The capping layer 181 may include a silicon nitride (SiNx) layer.

Figure 12:
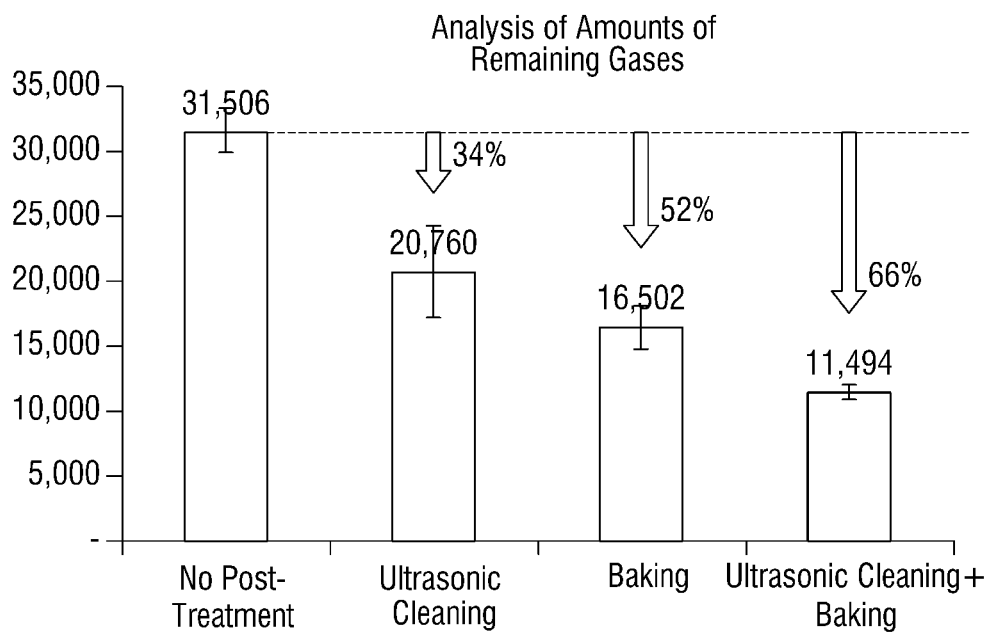
FIG. 12 is a graph showing amounts of gases remaining in a light converter of a display device according to an exemplary embodiment of the present disclosure.

FIG. 12 is a graph showing amounts of gases remaining in a light converter of a display device according to an exemplary embodiment of the present disclosure after different post-treatments. To identify the advantageous effects of the display device according to an exemplary embodiment of the present disclosure, post-treatment was performed on each of samples #1 through #4, as shown in Table 1 below, and the amount of gases remaining in the light converter of each of samples #1 through #4, particularly, the amount of a hydrogen gas ($H_2$), was measured.

TABLE 1

| Sample | Ultrasound | Baking | Remarks |
| --- | --- | --- | --- |
| #1 | Skip | Skip | Comparison Group (ref.) |
| #2 | Applied | Skip | Only Ultrasound Cleaning Applied |
| #3 | Skip | Applied | Only Baking Applied |
| #4 | Applied | Applied | Ultrasound Cleaning + Baking |

Referring to FIG. 12, sample #2, which was subjected to physical impact through ultrasonic cleaning, released about 34% more hydrogen gas than sample #1, a comparison group subjected to no post-treatment. In the light converter of the display device according to an exemplary embodiment of the present disclosure, in which uneven patterns are formed on the sides of each wavelength conversion layer and on the sides of a light-transmitting layer, cracks may be formed by physical impact caused by, for example, ultrasonic cleaning. Then, gases remaining in the light converter can be released through the cracks.

Sample #3, which was subjected to high-temperature baking, released about 52% more hydrogen gas than sample #1. Specifically, sample #3 was subjected to baking at as high a temperature as 180° C. Sample #3 released more hydrogen gas than sample #2. However, if such high-temperature baking is continued to release more gas, the wavelength conversion layers of the light converter of the display device may deteriorate.

Sample #4, which was subjected to both ultrasonic cleaning and high-temperature baking, released about 66% more hydrogen gas than sample #1. Also, sample #4 released more hydrogen gas than sample #2, which was subjected only to ultrasonic cleaning, and sample #3, which was subjected only to high-temperature baking.

Specifically, sample #4, which was subjected to both ultrasonic cleaning and high-temperature baking, released the largest amount of hydrogen gas, and sample #3, which was subjected only to high-temperature baking, released the second largest amount of hydrogen gas. In a case in which wavelength conversion layers and a light-transmitting layer, each having uneven patterns, were employed, sample #2, which was subjected only to ultrasonic cleaning, released a smaller amount of hydrogen gas than sample #3, which was subjected only to high-temperature baking, but is still considered meaningful because it shows, unlike sample #3, that the hydrogen gas remaining in the light converter of the display device according to an exemplary embodiment of the present disclosure can be released without affecting the optical characteristics of the display device according to an exemplary embodiment of the present disclosure.

FIGS. 13 through 18 are plan views of light converters of display devices according to some exemplary embodiments of the present disclosure. FIGS. 13 through 18 illustrate various exemplary light converters each including uneven patterns PA. For convenience, only first and second wavelength conversion layers (161 and 162 in FIG. 1), a light-transmitting layer (151 in FIG. 1), and uneven patterns (PA in FIG. 3) formed on the sides of each of the light-transmitting layer and the first and second wavelength conversion layers are illustrated in FIGS. 13 through 18. Referring to FIGS. 13 through 18, each of the light-transmitting layer and the first and second wavelength conversion layers may include a plurality of uneven patterns PA, which are projected outwardly, or recessed from, the left side, the right side, or both sides of each of the light-transmitting layer and the first and second wavelength conversion layers. The numbers of uneven patterns PA, illustrated in FIGS. 13 through 18, are merely exemplary, and each of the light converters of FIGS. 13 through 18 may include more uneven patterns PA than those illustrated in FIGS. 13 through 18, for example.

Figure 13:
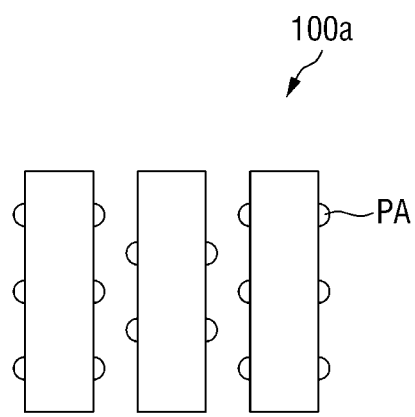
FIGS. 13 through 18 are plan views of light converters of display devices according to some exemplary embodiments of the present disclosure.
Figure 14:
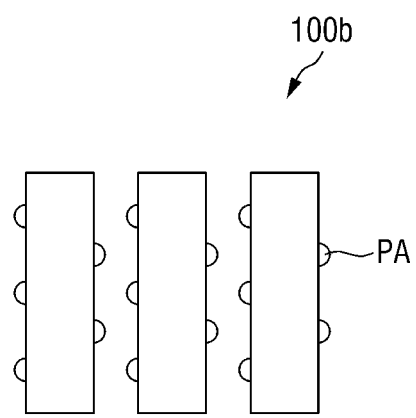

FIG. 13 illustrates a light converter 100a in which uneven patterns PA are symmetrically formed. FIG. 14 illustrates a light converter 100b in which uneven patterns PA are formed in a staggered manner. Referring to FIG. 13, the light converter 100a may include first and second wavelength conversion layers and a light-transmitting layer that are spaced apart from one another. Uneven patterns PA may be formed on both sides of each of the light-transmitting layer and the first and second wavelength conversion layers to be symmetrical with respect to a central plane equidistant from both sides of each of the light-transmitting layer and the first and second wavelength conversion layers. The uneven patterns PA may be staggered with respect to one another between the opposing sides of each pair of adjacent layers to be prevented from being in contact with one another. Referring to FIG. 14, uneven patterns PA may be formed on both sides of each of a light-transmitting layer and first and second wavelength conversion layers to be staggered with respect to a central plane equidistant from both sides of each of the light-transmitting layer and the first and second wavelength conversion layers. The uneven patterns PA may also be staggered with respect to one another between the opposing sides of each pair of adjacent layers to be prevented from being in contact with one another.

Figure 15:
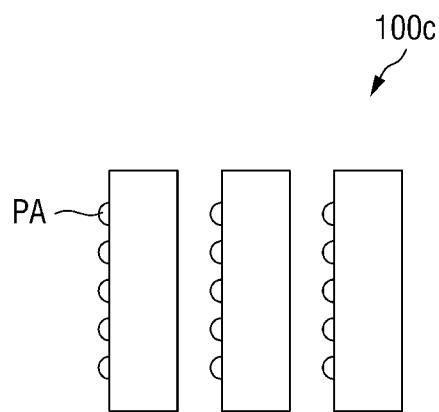
Figure 16:
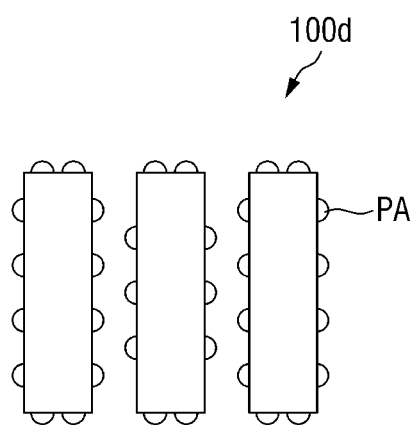

FIG. 15 illustrates a light converter 100c in which uneven patterns PA are formed on one side of each of a light-transmitting layer and first and second wavelength conversion layers. FIG. 16 illustrates a light converter 100d in which uneven patterns PA are formed on all sides of each of a light-transmitting layer and first and second wavelength conversion layers. Referring to FIG. 15, uneven patterns PA may be formed only on the left side or the right side of each of the light-transmitting layer and the first and second wavelength conversion layers. In the exemplary embodiment of FIG. 15, the uneven patterns PA may be densely formed on the left side or the right side of each of the light-transmitting layer and the first and second wavelength conversion layers in order to cause more cracks and sufficiently release the gases remaining in the light converter 100c. Referring to FIG. 16, uneven patterns PA may be formed on all sides of each of a light-transmitting layer and first and second wavelength conversion layers. According to the exemplary embodiment of FIG. 16, the gases remaining in the light converter 100d can be effectively released by forming the uneven patterns PA on all sides of each of the light-transmitting layer and the first and second wavelength conversion layers, which are formed as stripes. Even in a case in which the light-transmitting layer and the first and second wavelength conversion layers are not formed as stripes, the gases remaining in the light converter 100d can still be effectively released by forming the uneven patterns PA on all the sides of each of the light-transmitting layer and the first and second wavelength conversion layers.

Figure 17:
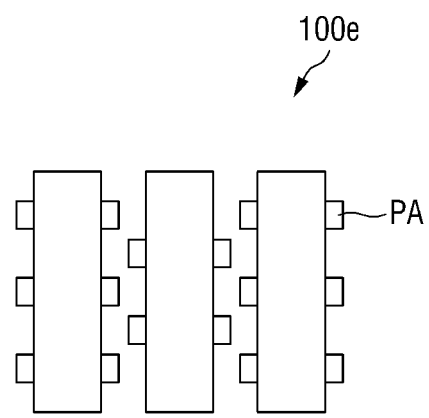

FIG. 17 illustrates a light converter 100e in which uneven patterns PA are formed as rectangles. Referring to FIG. 17, the uneven patterns PA of the light converter 100e may be rectangular, triangular, or polygonal in shape. The shape of the uneven patterns PA of the light converter 100e is not particularly limited as long as the uneven patterns PA can effectively induce cracks to be formed at desired locations. That is, the uneven patterns PA of the light converter 100e may be formed to have an elliptical shape, a heart shape, or a peanut shape, for example.

Figure 18:
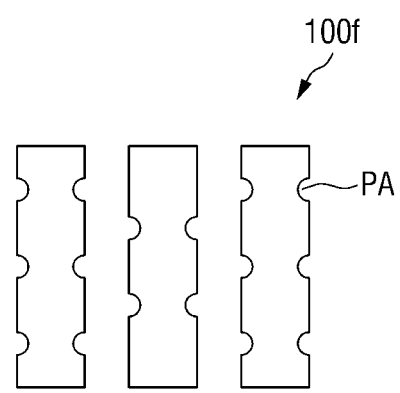

FIG. 18 illustrates a light converter 100f in which uneven patterns PA are formed as recesses. Referring to the light converter 100f of FIG. 18, the uneven patterns PA are formed as recesses on both sides of each of a light-transmitting layer and first and second wavelength conversion layers. As mentioned above with reference to FIGS. 13 through 17, the uneven patterns PA may be formed on only one side of each of the light-transmitting layer and the first and second wavelength conversion layers or on more than one side or all the sides of each of the light-transmitting layer and the first and second wavelength conversion layers. The shape of the uneven patterns PA of the light converter 100f is not particularly limited as long as the uneven patterns PA can effectively induce cracks to be formed at desired locations.

Figure 19:
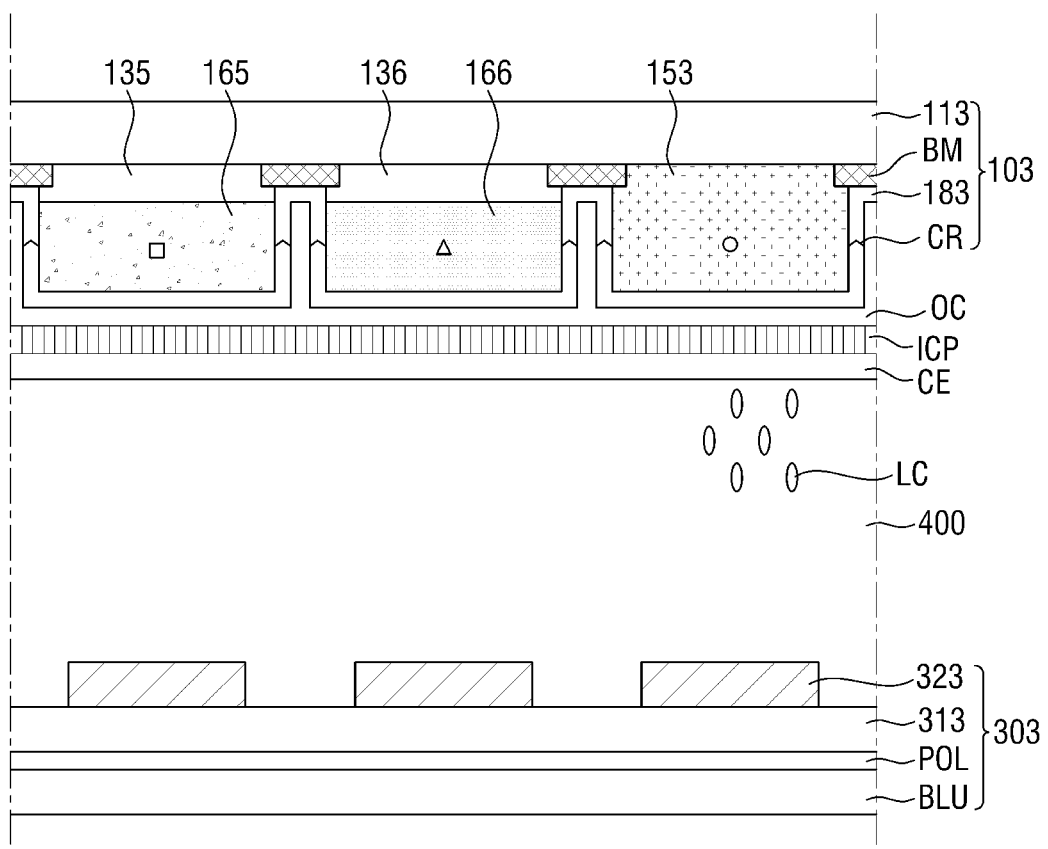
FIG. 19 is a cross-sectional view of a display device according to another exemplary embodiment of the present disclosure.

FIG. 19 is a cross-sectional view of a display device according to another exemplary embodiment of the present disclosure. Descriptions of elements or features that have already been described above with reference to FIG. 1 will not be repeated.

Referring to FIG. 19, in an embodiment, the display device may include a light converter 103, a planarization layer OC, an upper polarization layer ICP, an upper common electrode CE, a light provider 303, lower pixel electrodes 323, and a liquid crystal layer 400.

In an embodiment, the light converter 103 may include a first substrate 113, a black matrix BM, a first filter 135, a second filter 136, a light-transmitting layer 153, a first wavelength conversion layer 165, a second wavelength conversion layer 166, and a third filter 183. The third filter 183 may include cracks CR. The shape of the cracks CR may be as illustrated in any of FIGS. 4 through 8. The cracks CR may become passages through which the gases remaining in the first wavelength conversion layer 165, the second wavelength conversion layer 166, and the light-transmitting layer 153 are released.

The first substrate 113, the black matrix BM, the first filter 135, the second filter 136, the light-transmitting layer 153, the first wavelength conversion layer 165, the second wavelength conversion layer 166, and the third filter 183 may be the same or similar as their respective counterparts of FIG. 1, and, thus, detailed descriptions thereof will be omitted.

The planarization layer OC may be disposed on the third filter 183. The planarization layer OC may provide flatness to the upper polarization layer ICP. That is, in case the first wavelength conversion layer 165, the second wavelength conversion layer 166, and the light-transmitting layer 153 are formed to have different thicknesses, the planarization layer OC may make the heights of the first wavelength conversion layer 165, the second wavelength conversion layer 166, and the light-transmitting layer 153 uniform.

The material of the planarization layer OC is not particularly limited as long as it has a planarization characteristic. In an exemplary embodiment, the planarization layer OC may comprise an organic material. For example, the organic material may include a cardo resin, a polyimide resin, an acrylic resin, a siloxane resin, or a silsesquioxane resin.

The upper polarization layer ICP may be disposed on the planarization layer OC. In an exemplary embodiment, the upper polarization layer ICP may be a wire grid polarizer. The upper polarization layer ICP will herein be described as being a wire grid polarizer.

The upper polarization layer ICP may include a plurality of linear lattice patterns. In an exemplary embodiment, the plurality of linear lattice patterns may comprise a conductive material. In an exemplary embodiment, the conductive material may comprise a metal, such as Al, Ag, Au, copper (Cu), or Ni, and may further comprise titanium (Ti) or molybdenum (Mo). In another exemplary embodiment, the plurality of linear lattice patterns may have a structure in which at least two pattern layers are stacked. For example, in a case in which light provided to the upper polarization layer ICP passes through the upper polarization layer ICP, components parallel to the upper polarization layer ICP may be absorbed or reflected by the upper polarization layer ICP, and only components perpendicular to the upper polarization layer ICP may be transmitted through the upper polarization layer ICP, thereby realizing polarization. In an exemplary embodiment, the upper polarization layer ICP may be formed by nanoimprinting.

The upper common electrode CE may be disposed on the upper polarization layer ICP. The upper common electrode CE may be disposed to overlap with first, second, and third pixel electrode units PE1, PE2, and PE3. In an exemplary embodiment, the upper common electrode CE may be in the shape of a plate. The upper common electrode CE may include a plurality of slits. In an exemplary embodiment, the upper common electrode CE may be formed as a transparent or translucent electrode or may comprise a reflective metal, such as Al, Ag, Cr, or an alloy thereof. The transparent or translucent electrode may comprise at least one selected from the group consisting of ITO, IZO, ZnO, $In_2O_3$, indium gallium oxide (IGO), and Al-doped zinc oxide (AZO).

In an embodiment, the light provider 303 may include a second substrate 313, a backlight unit BLU, and a lower polarization layer POL.

In an exemplary embodiment, the second substrate 313 may be a transparent insulating substrate. In an embodiment, the transparent insulating substrate may comprise glass, quartz, or transparent plastic. In an exemplary embodiment, the second substrate 313 may be a flexible substrate that is bendable, foldable, or rollable.

The backlight unit BLU may be disposed below the second substrate 313 and may provide light having a particular wavelength band to the light converter 103. The light provided by the backlight unit BLU to the light converter 103 may be third-color light L3 having a third wavelength band. For example, the backlight unit BLU may provide blue light to the light converter 103. The light converter 103 may be disposed on the optical path of the third-color light L3 provided by the backlight unit BLU and may display an image based on the provided third-color light L3.

The backlight unit BLU may include a light source emitting light and a light guide plate guiding the light emitted by the light source and providing the guided light to the light converter 103. The type of the light source is not particularly limited. In an exemplary embodiment, the light source may include light-emitting diodes (LEDs) or laser diodes (LDs). The material of the light guide plate is not particularly limited. In an exemplary embodiment, the light guide plate may be formed of glass, quartz, or a plastic material, such as polyethylene terephthalate (PET) or polycarbonate (PC).

Although not specifically illustrated, the backlight unit BLU may include one or more optical sheets. In an embodiment, the optical sheets may include at least one of a prism sheet, a diffusion sheet, a lenticular lens sheet, and a micro-lens sheet. The optical sheets can improve the display quality of the display device by modulating the optical characteristics (e.g., condensation, diffusion, scattering, or polarization characteristics) of light emitted from the backlight unit BLU.

The lower polarization layer POL may be disposed on an optical path between the second substrate 313 and the backlight unit BLU. In an exemplary embodiment, the lower polarization layer POL may be disposed below the second substrate 313. However, the location of the lower polarization layer POL is not particularly limited to that illustrated in FIG. 19. In an exemplary embodiment, the lower polarization layer POL may be disposed between the second substrate 313 and the liquid crystal layer 400. The lower polarization layer POL may be a reflective polarization layer. In a case in which the lower polarization layer POL is a reflective polarization layer, the lower polarization layer POL may reflect components parallel to a reflection axis thereof while transmitting components parallel to a transmission axis thereof therethrough.

In an exemplary embodiment, the lower polarization layer POL may be in direct contact with the second substrate 313. That is, the lower polarization layer POL may be formed on a surface of the second substrate 313 by a continuous process. In another exemplary embodiment, the lower polarization layer POL may be coupled to a surface of the second substrate 313 by an additional adhesive layer. In an exemplary embodiment, the additional adhesive layer may be a pressure sensitive adhesive (PSA), an OCA, or an OCR.

The lower pixel electrodes 323 may be disposed on the second substrate 313. The lower pixel electrodes 323 may be disposed to overlap with first, second, and third pixel units SP1, SP2, and SP3 and may be spaced apart from one another.

The liquid crystal layer 400 may be disposed between the light converter 103 and the light provider 303. The liquid crystal layer 400 may include a plurality of liquid crystal molecules LC that are initially aligned. The liquid crystal molecules LC may have negative dielectric anisotropy and may be vertically aligned in their initial alignment state. The liquid crystal molecules LC may have a pretilt angle (e.g., a predetermined pretilt angle) in their initial alignment state. In response to an electric field being generated between the lower pixel electrodes 323 and the upper common electrode CE, the liquid crystal molecules LC may be tilted or rotated in a particular direction to change the polarization state of light passing through the liquid crystal layer 400.

In the above description, the present invention has been described based on some exemplary embodiments, but the exemplary embodiments are merely illustrative, and do not limit the present invention, and those skilled in the art will appreciate that various modifications and applications, which are not exemplified in the above description, may be made without departing from the scope of the essential characteristic of the present exemplary embodiments. For example, components described in the exemplary embodiments can be modified and executed. Therefore, it should be construed that contents associated with the combination and modification are included in the scope of the present invention.

What is claimed is:

1. A display device comprising:
   a light provider;
   a wavelength conversion layer above the light provider and including a first surface and sides; and
   a capping layer on the wavelength conversion layer and including a first area provided on the sides of the wavelength conversion layer and a second area provided on the first surface of the wavelength conversion layer,
   wherein the first area of the capping layer includes cracks.

2. The display device of claim 1, wherein the cracks penetrate the capping layer in a thickness direction.

3. The display device of claim 2, wherein the sides of the wavelength conversion layer where the cracks are formed are not covered by the capping layer.

4. The display device of claim 3, further comprising:
   a third filter on the capping layer,
   wherein the third filter at least partially fills the cracks.

5. The display device of claim 4, wherein
   in a plan view, the sides of the wavelength conversion layer extend in a first direction, and
   the display device further comprises a first filter extending in a same direction as the sides of the wavelength conversion layer.

6. The display device of claim 1, wherein
   in a plan view, the wavelength conversion layer includes a first side and a second side opposite to the first side, and
   the first side comprises first uneven patterns including a plurality of protruding parts and a plurality of recessed parts.

7. The display device of claim 6, wherein the second side comprises second uneven patterns including a plurality of protruding parts and a plurality of recessed parts.

8. The display device of claim 7, wherein the first uneven patterns and the second uneven patterns are symmetrical with respect to a central line equidistant from both the first and second sides.

9. The display device of claim 7, wherein the first uneven patterns and the second uneven patterns are staggered with respect to a central line equidistant from both the first and second sides.

10. The display device of claim 7, wherein
    the wavelength conversion layer further includes a third side perpendicular to the first and second sides and a fourth side opposite to the third side,
    the third side comprises third uneven patterns, and
    the fourth side comprises fourth uneven patterns.

11. The display device of claim 6, wherein, in a plan view, the second side is linear.

12. The display device of claim 1, further comprising:
    a black matrix on or below the wavelength conversion layer to at least partially overlap with the wavelength conversion layer, the black matrix surrounding the wavelength conversion layer in a plan view.

13. The display device of claim 12, wherein, in a plan view, the sides of the wavelength conversion layer include protruding parts that are outwardly projected and recessed parts that are recessed relative to the protruding parts.

14. The display device of claim 13, wherein the sides of the wavelength conversion layer overlap with the black matrix.

15. The display device of claim 14, wherein the cracks are provided in the protruding parts.

16. The display device of claim 14, wherein the cracks are provided in the recessed parts.

17. The display device of claim 14, wherein the cracks extend across multiple protruding parts and multiple recessed parts.

18. The display device of claim 14, wherein the cracks are provided in the second area and overlap with the black matrix.

19. A display device comprising:
    a light provider comprising a first pixel electrode unit and a second pixel electrode unit adjacent to the first pixel electrode unit in a first direction; and
    a light converter above the light provider, the light converter comprising a first wavelength conversion layer above the first pixel electrode unit, a second wavelength conversion layer above the second pixel electrode unit, and a capping layer between the first and second wavelength conversion layers,
    wherein
    in a plan view, the first wavelength conversion layer includes first and second sides extending in a second direction, which is perpendicular to the first direction,
    in a plan view, the second wavelength conversion layer includes third and fourth sides extending in the second direction,
    the second and third sides are adjacent to each other, and
    in a plan view, each of the first, second, third, and fourth sides includes a reference line and a plurality of uneven patterns that are outwardly projected or recessed from the reference line,
    wherein each of the first wavelength conversion layer and the second wavelength conversion layer comprises a lower surface facing the light provider, and
    wherein the capping layer is further disposed on the respective lower surface.

20. A display device comprising:
a light provider comprising a first pixel electrode unit and a second pixel electrode unit adjacent to the first pixel electrode unit in a first direction; and
a light converter above the light provider, the light converter comprising a first wavelength conversion layer above the first pixel electrode unit, a second wavelength conversion layer above the second pixel electrode unit, and a capping layer between the first and second wavelength conversion layers,
wherein
in a plan view, the first wavelength conversion layer includes first and second sides extending in a second direction, which is perpendicular to the first direction,
in a plan view, the second wavelength conversion layer includes third and fourth sides extending in the second direction,
the second and third sides are adjacent to each other,
in a plan view, each of the second and third sides includes a reference line and a plurality of uneven patterns that are outwardly projected or recessed from the reference line, and
the uneven patterns of the second side and the uneven patterns of the third side are staggered with respect to a central line equidistant from both the second and third sides.

* * * * *